(12) United States Patent
Cheng et al.

(10) Patent No.: US 10,078,721 B2
(45) Date of Patent: Sep. 18, 2018

(54) DETERMINING THE RESISTANCE OF A CONDUCTING STRUCTURE

(71) Applicant: Synopsys, Inc., Mountain View, CA (US)

(72) Inventors: Xiaoxu Cheng, Mountain View, CA (US); Jingyu Xu, Beijing (CN); Hau-Yung Chen, Mountain View, CA (US); Dick Liu, Mountain View, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 15/173,069

(22) Filed: Jun. 3, 2016

(65) Prior Publication Data

US 2017/0351803 A1   Dec. 7, 2017

(51) Int. Cl.
*G06F 17/50*   (2006.01)

(52) U.S. Cl.
CPC ...... *G06F 17/5081* (2013.01); *G06F 17/5072* (2013.01)

(58) Field of Classification Search
CPC ............. G06F 17/5018; G06F 17/5081; G06F 2217/78; G06F 17/5068; G06F 17/5072; G06F 2217/12
See application file for complete search history.

(56) References Cited

U.S. PATENT DOCUMENTS

| 8,499,263 | B1 * | 7/2013 | Shi ...................... G06F 17/5018 716/100 |
| 2015/0143317 | A1 * | 5/2015 | Gibson ............... G06F 17/5036 716/115 |

OTHER PUBLICATIONS

"Using Articulation Nodes to Improve the Efficiency of Finite-Element based Resistance Extraction", by A.J. van Genderen, and N.P. Van der Meijs, @1996 ACM.*

* cited by examiner

*Primary Examiner* — Nha Nguyen
(74) *Attorney, Agent, or Firm* — Park, Vaughan, Fleming & Dowler LLP; Laxman Sahasrabuddhe

(57) ABSTRACT

Systems and techniques are described for determining a resistance of a conducting structure. The conducting structure can be partitioned into a set of polygons based on (1) equipotential lines and (2) boundaries of the conducting structure. Next, a matrix equation can be constructed, wherein for at least one polygon in the set of polygons, electric potentials of boundary elements on the boundaries of the polygon are represented by linear combinations of electric potentials of two or more equipotential lines. The resistance of the conducting structure can then be determined by solving the matrix equation.

3 Claims, 6 Drawing Sheets

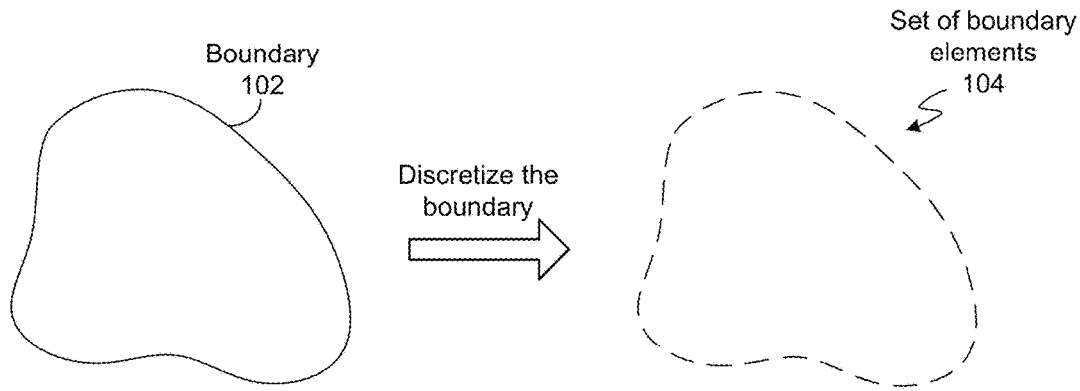
**FIG. 1A
(PRIOR ART)**
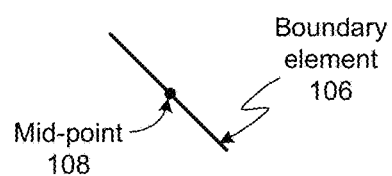
**FIG. 1B
(PRIOR ART)**
**FIG. 1C
(PRIOR ART)**

```
┌─────────────────────────────────────────────────────────┐
│ Partition a conducting structure into a set of polygons │
│ based on (1) equipotential lines and (2) boundaries of  │
│ the conducting structure                                │
│ 202                                                     │
└─────────────────────────────────────────────────────────┘
                            ↓
┌─────────────────────────────────────────────────────────┐
│ Construct a matrix equation, wherein for at least one   │
│ polygon in the set of polygons, electric potentials of  │
│ at least some boundary elements on the boundaries of    │
│ the polygon are represented by linear combinations of   │
│ electric potentials of two or more equipotential lines  │
│ 204                                                     │
└─────────────────────────────────────────────────────────┘
                            ↓
┌─────────────────────────────────────────────────────────┐
│ Determine the resistance of the conducting structure by │
│ solving the matrix equation                             │
│ 206                                                     │
└─────────────────────────────────────────────────────────┘
```

FIG. 2A

DETERMINING THE RESISTANCE OF A CONDUCTING STRUCTURE

BACKGROUND

Technical Field

This disclosure relates to integrated circuits (ICs). More specifically, this disclosure relates to determining the resistance of a conducting structure.

Related Art

Advances in process technology and an almost insatiable appetite for consumer electronics have fueled a rapid increase in the size and complexity of IC designs. Accurate estimation of parasitic resistances has become very important for accurately performing subsequent timing or signal integrity analyses. Since miniaturization is expected to continue relentlessly, accurate estimation of parasitic resistances is expected to become even more critical in the future.

A number of techniques can be used to determine the resistance of a conducting structure. These techniques include, but are not limited to, Finite Element Method (FEM), Boundary Element Method (BEM), and Fast Multipole Method (FMM). All of these techniques create a matrix equation (which represents a system of linear equations), and determine the resistance by solving the matrix equation. A significant amount of computational time and computational resources are spent on constructing and solving the matrix equation.

FEM techniques discretize the entire area of the conducting structure (or discretize the entire volume if the conducting structure is a 3-D structure). In contrast, BEM techniques discretize only the boundaries of the conducting structure. Therefore, BEM techniques typically result in a smaller matrix than FEM techniques. In BEM, an integral equation is formulated based on the linear partial differential equations that describe the physical phenomenon of interest, and BEM attempts to find a solution based on the constraint that a given set of boundary conditions must be satisfied. BEM techniques are well known in the art. For example, details of BEM can be found in numerous references, such as Becker, A. A. *The Boundary Element Method in Engineering: A Complete Course*. London: McGraw-Hill, 1992, which is herein incorporated by reference to provide details of BEM.

FIGS. 1A-1C illustrate how BEM can be used to determine resistance of a conducting structure. Boundary 102 of a conducting structure can be discretized to obtain a set of boundary elements 104, which are shown in FIG. 1A using dashed lines. As shown in FIG. 1B, a value (e.g., current density, voltage, etc.) associated with a given boundary element, e.g., boundary element 106, can be computed at the mid-point 108 of the boundary element 106. In a typical BEM approach, two values—(1) a potential, and (2) a partial derivative of the potential along a normal direction to the boundary element—are associated with each boundary element. At each boundary element, one of the two values is known, and the other value is unknown. The values associated with each boundary element are linearly related to other values associated with other boundary elements, and this linear relationship can be represented using a matrix equation.

In FIG. 1C, matrix equation 110 includes coefficient matrix 112, unknown vector 114, and constant vector 116. If the number of boundary elements is N, then there are a total of 2N values in the BEM problem (because there are two values associated with each boundary element). Of these 2N values, N are known and the other N are unknown. The values in constant vector 116 are constants which are calculated based on the boundary conditions at the boundary elements. Unknown vector 114 contains the variables whose values are to be determined. Once matrix equation 110 has been created, it can be solved to determine unknown vector 114, thereby determining the N unknown values.

When BEM is used to determine the resistance, the two values associated with each boundary element can be (1) the electric potential (i.e., voltage), and (2) the partial derivative of the electric potential along the normal direction to the boundary element. Note that the partial derivative of the electrical potential is proportional to the current density, so the two values associated with each boundary element can be (1) the voltage at the mid-point of the boundary element, and (2) the current density at the mid-point of the boundary element.

The constant vector 116 can include values that are computed based on known voltages and known current densities at the boundary elements. The coefficients in coefficient matrix 112 are based on the relationships between the voltages and current densities of the boundary elements, and can be computed based on the physical properties (e.g., resistivity, shape, dimensions, etc.) of the conducting structure. Once matrix equation 110 has been constructed, it can be solved to determine the unknown vector 114, thereby obtaining voltages and current densities at all boundary elements. These voltage and current density values can then be used to determine the resistance of the conducting structure.

FMM techniques can be used to improve the computational efficiency for generating coefficient matrix 112 (see e.g., Liu, Y. j., and N. Nishimura. "The Fast Multipole Boundary Element Method for Potential Problems: A Tutorial." Engineering Analysis with Boundary Elements 30.5 (2006): 371-81). However, the size of the matrix can still be very large and it can take an unacceptably large amount of computational time and resources to construct the matrix and to determine the resistance by using existing BEM or FMM techniques. Hence, what are needed are apparatuses and techniques for accurately and efficiently determining the resistance of a conducting structure.

SUMMARY

Some embodiments described herein provide techniques and systems for determining the resistance of a conducting structure in an IC layout. Some embodiments can partition the conducting structure into a set of polygons based on (1) equipotential lines and (2) boundaries of the conducting structure. Next, the embodiments can construct a matrix equation, wherein for at least one polygon in the set of polygons, electric potentials of at least some boundary elements on the boundaries of the polygon are represented by linear combinations of electric potentials of two or more equipotential lines. The embodiments can then determine the resistance of the conducting structure by solving the matrix equation.

Some embodiments can determine the equipotential lines in the conducting structure by using a pattern matching technique. Specifically, in some embodiments, the pattern matching technique can scan the conducting structure in a given direction and detect a presence of an equipotential line if a parallel run length of two adjacent boundaries in the conducting structure is greater than a distance between the two adjacent boundaries in the conducting structure.

Some embodiments can discretize the boundaries of the conducting structure to obtain a set of boundary elements.

Next, the embodiments can store, in a data structure, an association between (1) each polygon in the set of polygons and (2) boundary elements in the set of boundary elements that are located on boundaries of the polygon. This association can then be used for constructing the matrix equation.

Some embodiments can use the determined resistance of the conducting structure to determine whether or not an IC chip manufactured based on the IC layout is expected to perform as desired.

BRIEF DESCRIPTION OF THE FIGURES

FIGS. 1A-1C illustrate how BEM can be used to determine resistance of a conducting structure.

FIG. 2A illustrates a process for determining a resistance of a conducting structure in accordance with some embodiments described herein.

DETAILED DESCRIPTION

Figure 2B:
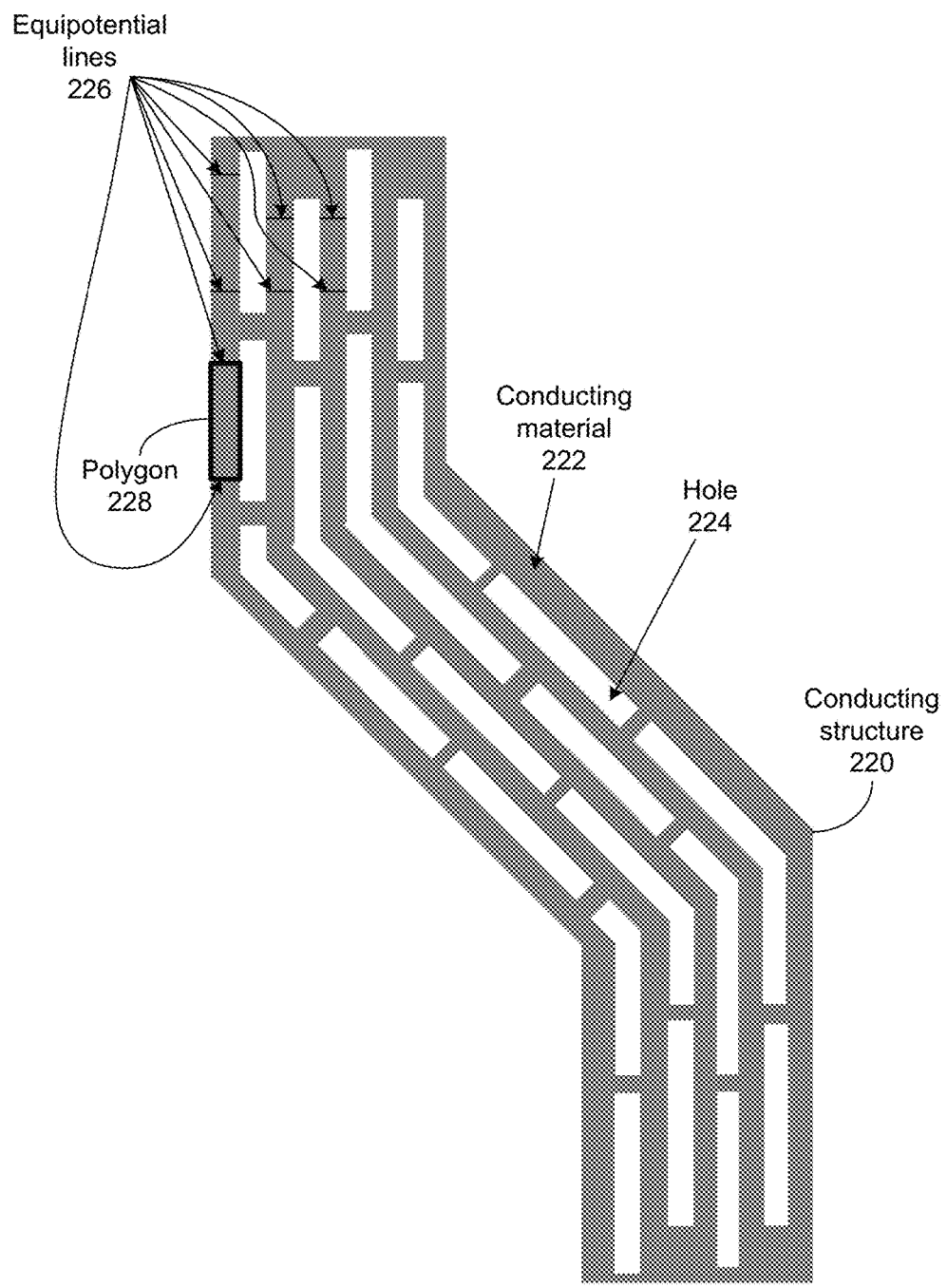
FIG. 2B illustrates a conducting structure in an IC layout in accordance with some embodiments described herein.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Overview of IC Design and Manufacturing

IC design software tools can be used to create an IC design. Once the IC design is finalized, it can undergo fabrication, packaging, and assembly to produce IC chips. The overall IC design and manufacturing process can involve multiple actors, e.g., one company may create the software for designing ICs, another company may use the software to create the IC design, and yet another company may manufacture IC chips based on the IC design. An IC design flow can include multiple steps, and each step can involve using one or more IC design software tools. An improvement to any one of the steps in the IC design flow results in an improvement to the overall IC design and manufacturing process. Specifically, the improved IC design and manufacturing process can produce IC chips with a shorter time-to-market (TTL) and/or higher quality of results (QoR). Some examples of IC design steps and the associated software tools are described below. These examples are for illustrative purposes only and are not intended to limit the embodiments to the forms disclosed.

Some IC design software tools enable IC designers to describe the functionality that the IC designers want to implement. These tools also enable IC designers to perform what-if planning to refine functionality, check costs, etc. During logic design and functional verification, the HDL (hardware description language), e.g., SystemVerilog, code can be written and the design can be checked for functional accuracy, e.g., the design can be checked to ensure that it produces the correct outputs.

During synthesis and design for test, the HDL code can be translated to a netlist using one or more IC design software tools. Further, the netlist can be optimized for the target technology, and tests can be designed and implemented to check the finished chips. During netlist verification, the netlist can be checked for compliance with timing constraints and for correspondence with the HDL code.

During design planning, an overall floorplan for the chip can be constructed and analyzed for timing and top-level routing. During physical implementation, circuit elements can be positioned in the layout and can be electrically coupled. Some embodiments described herein provide software tools that can be used during design planning. Specifically, some embodiments described herein enable transparent editing of physical data in hierarchical integrated IC design.

During analysis and extraction, the IC design's functionality can be verified at a transistor level and parasitics can be extracted. During physical verification, the design can be checked to ensure correctness for manufacturing, electrical issues, lithographic issues, and circuitry. Some embodiments described herein provide software tools that can be used for quickly and accurately extracting parasitic resistances in an IC design. The extracted parasitic resistances can then be used to perform accurate analysis of the IC design, and to perform accurate physical verification, thereby improving the overall IC design and manufacturing process.

During resolution enhancement, geometric manipulations can be performed on the layout to improve manufacturability of the design. During mask data preparation, the design can be "taped-out" to produce masks which are used during fabrication.

Process for Determining the Resistance

FIG. 2A illustrates a process for determining a resistance of a conducting structure in accordance with some embodiments described herein. The process can begin by partitioning the conducting structure into a set of polygons based on (1) equipotential lines and (2) boundaries of the conducting structure (operation 202). Next, the process can construct a matrix equation, wherein for at least one polygon in the set of polygons, electric potentials of at least some boundary elements on the boundaries of the polygon are represented by linear combinations of electric potentials of two or more equipotential lines (operation 204). The process can then determine the resistance of the conducting structure by solving the matrix equation (operation 206). In some embodiments, the matrix equation can be based on a BEM matrix equation. In other embodiments, the matrix equation can be based on an FMM matrix equation. In general, the process illustrated in FIG. 2A can be used with any BEM-based technique that determines the resistance of a conducting structure by (1) discretizing the boundary of the conducting structure to obtain a set of boundary elements, and (2) constructing a matrix equation based on the relationships between the known and unknown voltages and the known and unknown current densities at the boundary elements.

FIG. 2B illustrates a conducting structure in an IC layout in accordance with some embodiments described herein. Conducting structure 220 in the IC layout is a representation of the actual physical conducting structure that will exist in an IC chip that is manufactured based on the IC layout. Conducting structure 220 can include conducting regions (shaded areas in FIG. 2B) that are made up of a conducting material 222 (e.g., metal), and holes (e.g., hole 224) where the conducting material 222 is absent (instead of holes, those areas may comprise an insulating material).

In operation 202, the process can determine equipotential lines in conducting structure 220. For example, the process can determine equipotential lines 226. Specifically, a scanline technique can be used to scan the conducting structure in a given direction, and to detect an equipotential line if a parallel run length of two adjacent boundaries in the conducting structure is greater than a distance between the two adjacent boundaries in the conducting structure. For example, equipotential lines 226 can be determined by sweeping a scanline from the top to the bottom (or from the bottom to the top) of conducting structure 220, and by keeping track of a parallel run length of two adjacent boundaries in the conducting structure. As soon as the scanline technique detects that the parallel run length of two adjacent boundaries in the conducting structure is greater than the distance between the two adjacent boundaries in the conducting structure, the technique can place an equipotential line at that location. In general, equipotential lines can be determined in the conducting structure by using any pattern matching technique that can detect a pattern in a conducting structure that results in one or more equipotential lines. The equipotential lines together with the boundaries of the conducting structure can define polygons in the conducting structure. For example, consider polygon 228: the top and the bottom sides are equipotential lines, and the right and left sides are boundaries of the conducting structure.

Figure 2C:
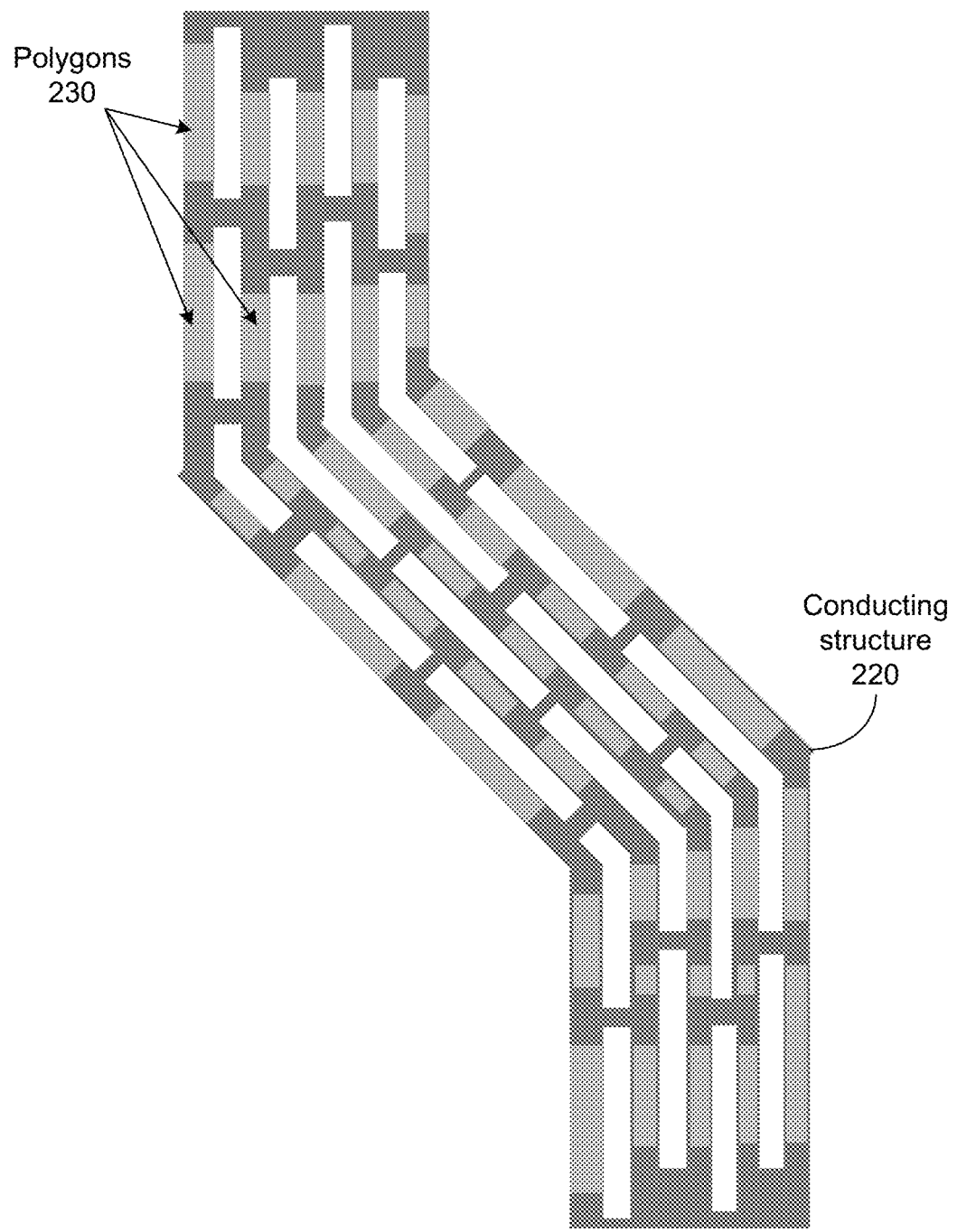
FIG. 2C illustrates a set of polygons that were determined based on a set of equipotential lines and the boundaries of the conducting structure in accordance with some embodiments described herein.

FIG. 2C illustrates a set of polygons that were determined based on a set of equipotential lines and the boundaries of the conducting structure in accordance with some embodiments described herein. Specifically, in FIG. 2C, conducting structure 220 has been partitioned into a set of polygons (shown in FIG. 2C as shaded rectangles, e.g., polygons 230) based on (1) equipotential lines and (2) boundaries of the conducting structure.

Figure 2D:
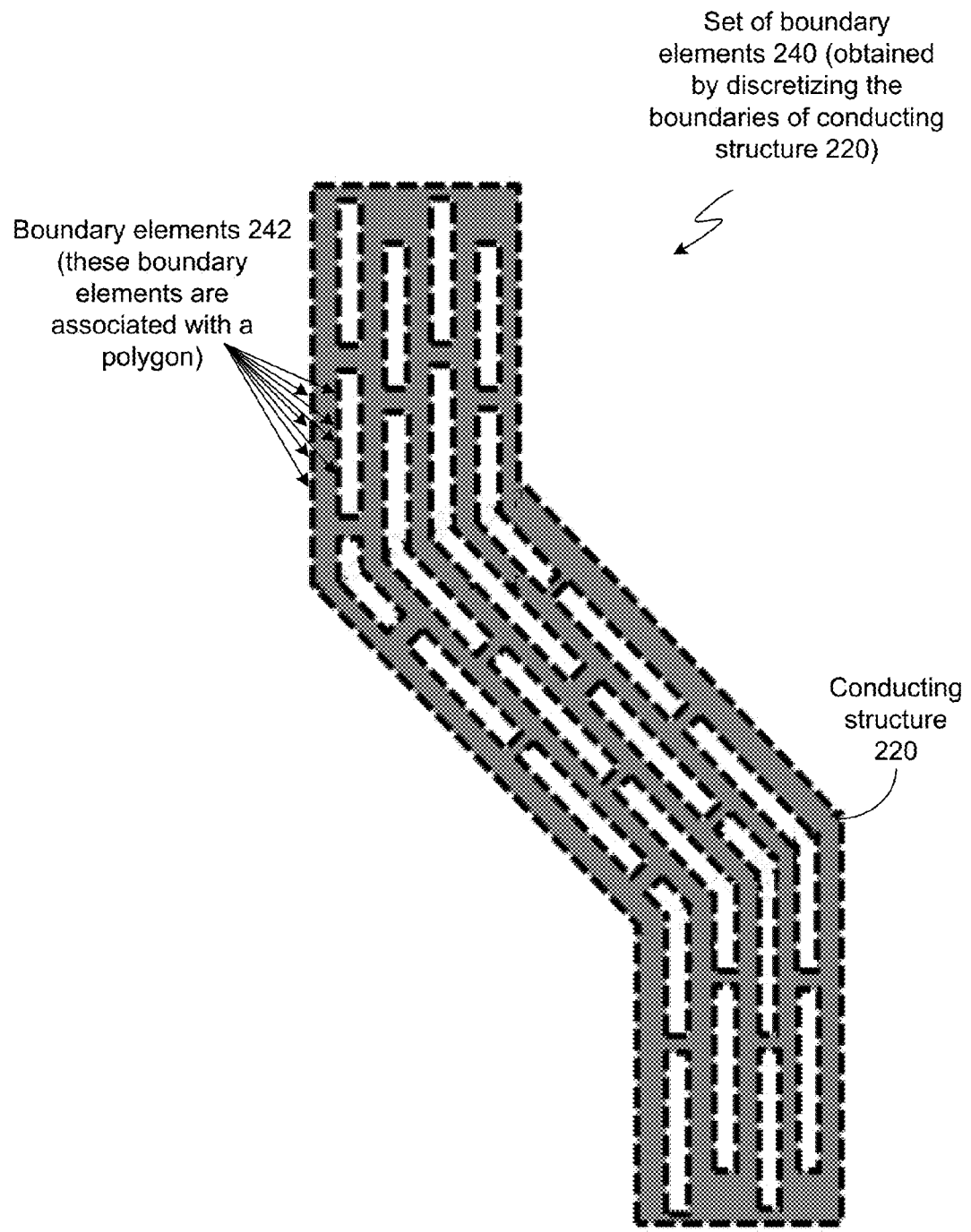
FIG. 2D illustrates how the boundaries of a conducting structure can be discretized in accordance with some embodiments described herein.

Next, the boundaries of the conducting structure can be discretized to obtain a set of boundary elements. FIG. 2D illustrates how the boundaries of a conducting structure can be discretized in accordance with some embodiments described herein. Specifically, set of boundary elements 240 can be obtained by discretizing conducting structure 220. In FIG. 2D, each boundary element is shown as a short thick line on one of the boundaries of conducting structure 220. Note that some of the boundary elements will coincide with the polygon boundaries that were determined in operation 202. For example, boundary elements 242 in FIG. 2D are along the right and left boundaries of a polygon that was shown in FIG. 2C. This association between polygons that were determined in operation 202 and the boundary elements that were obtained after discretization can be maintained in a data structure, and the data structure can be subsequently used to substantially reduce the size of the matrix equation when the matrix equation is being constructed.

Figure 2E:
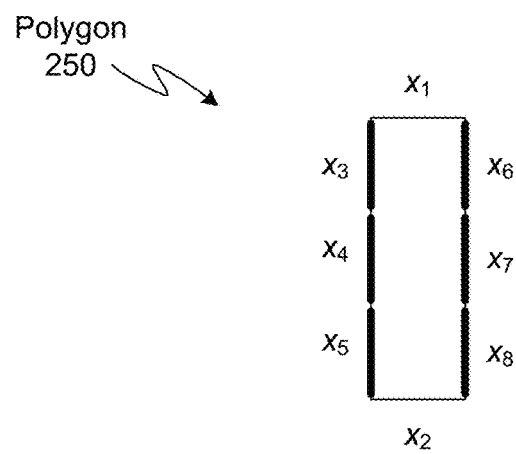
FIG. 2E illustrates how a substantially smaller matrix equation can be constructed in accordance with some embodiments described herein.

FIG. 2E illustrates how a substantially smaller matrix equation can be constructed in accordance with some embodiments described herein. Let variables $x_1$ and $x_2$ correspond to the unknown electric potentials (i.e., voltages) associated with the equipotential lines that correspond to the top and bottom edges of polygon 250. Let variables $x_3$ through $x_8$ correspond to the unknown electric potentials (i.e., voltages) associated with the boundary elements that correspond to the right and left edges of polygon 250.

Variables $x_3$ through $x_8$ can be represented as a linear combination of electric potentials $x_1$ and $x_2$ based on the geometry of polygon 250 (for more complex geometries, a linear combination of electric potentials of three or more equipotential lines may be required). For example, if the electric potential is expected to vary linearly from the top edge of polygon 250 to the bottom edge of polygon 250, the following linear equations can be created for variables $x_3$ through $x_8$:

$$x_3 = x_6 = (0.75 \times x_1) + (0.25 \times x_2);$$

$$x_4 = x_7 = (0.5 \times x_1) + (0.5 \times x_2); \text{ and}$$

$$x_5 = x_8 = (0.25 \times x_1) + (0.75 \times x_2).$$

The above linear equations can be used to replace variables $x_3$ through $x_8$ with variables $x_1$ and $x_2$. Note that the coefficients in the coefficient matrix will need to be adjusted appropriately when the variables $x_3$ through $x_8$ are replaced with variables $x_1$ and $x_2$. The above linear equations allow us to reduce a system of eight equations that has eight variables (i.e., variables $x_1$ through $x_8$) into a system of two equations that has just two variables (i.e., variables $x_1$ and $x_2$). In this manner, embodiments described herein can construct a matrix equation that is significantly smaller than the matrix equation that is constructed by conventional BEM-based techniques.

To illustrate this point using another example, suppose a conventional BEM-based technique generates the following matrix equation (hereinafter "conventional matrix equation"):

$$\begin{pmatrix} a_{11} & a_{12} & a_{13} & a_{14} & a_{15} & a_{16} & a_{17} \\ a_{21} & a_{22} & a_{23} & a_{24} & a_{25} & a_{26} & a_{27} \\ a_{31} & a_{32} & a_{33} & a_{34} & a_{35} & a_{36} & a_{37} \\ a_{41} & a_{42} & a_{43} & a_{44} & a_{45} & a_{46} & a_{47} \\ a_{51} & a_{52} & a_{53} & a_{54} & a_{55} & a_{56} & a_{57} \\ a_{61} & a_{62} & a_{63} & a_{64} & a_{65} & a_{66} & a_{67} \\ a_{71} & a_{72} & a_{73} & a_{74} & a_{75} & a_{76} & a_{77} \end{pmatrix} \begin{pmatrix} x_1 \\ x_2 \\ x_3 \\ x_4 \\ x_5 \\ x_6 \\ x_7 \end{pmatrix} = \begin{pmatrix} y_1 \\ y_2 \\ y_3 \\ y_4 \\ y_5 \\ y_6 \\ y_7 \end{pmatrix}$$

In the conventional matrix equation, the boundary elements are numbered 1 through 7, and variables $x_i$ (these are unknown) and $y_i$ (these are known) correspond to the two values (e.g., voltage and current density) associated with boundary element i. Now, suppose boundary elements 1, 2, 5, 6, and 7 are associated with a polygon, and the $x_i$ values for these boundary elements are related by the following linear relationship:

$$\begin{pmatrix} k_{15} & k_{25} \\ k_{16} & k_{26} \\ k_{17} & k_{27} \end{pmatrix} \begin{pmatrix} x_1 \\ x_2 \end{pmatrix} = \begin{pmatrix} x_5 \\ x_6 \\ x_7 \end{pmatrix}$$

In the above linear relationship, the k values can be analytically determined based on the dimensions and geometry of the polygon and the resistivity of the conducting material. Substituting for $x_5$, $x_6$ and $x_7$ in the conventional matrix equation, we obtain the following smaller matrix equation (hereinafter "new matrix equation"):

$$\begin{pmatrix} b_{11} & b_{12} & a_{13} & a_{14} \\ b_{21} & b_{22} & a_{23} & a_{24} \\ b_{31} & b_{32} & a_{33} & a_{34} \\ b_{41} & b_{42} & a_{43} & a_{44} \end{pmatrix} \begin{pmatrix} x_1 \\ x_2 \\ x_3 \\ x_4 \end{pmatrix} = \begin{pmatrix} y_1 \\ y_2 \\ y_3 \\ y_4 \end{pmatrix}$$

Note that the "b" values in coefficient matrix are determined by linearly combining the "a" values in the conventional coefficient matrix with the "k" values in the linear relationship that was determined based on the polygon's geometry.

Embodiments described herein do not create the conventional matrix that is created by conventional BEM-based techniques. Instead, embodiments described herein directly determine the new matrix equation that is substantially smaller than the conventional matrix equation, which substantially reduces the amount of computational resources and time spent on creating the matrix equation. Specifically, in operation 204 of FIG. 2A, the process can directly construct the new matrix equation, wherein for at least one polygon in the set of polygons, electric potentials of boundary elements on the boundaries of the polygon are represented by linear combinations of electric potentials of two or more equipotential lines. Moreover, a substantially smaller matrix equation is also faster to solve.

Figure 3:
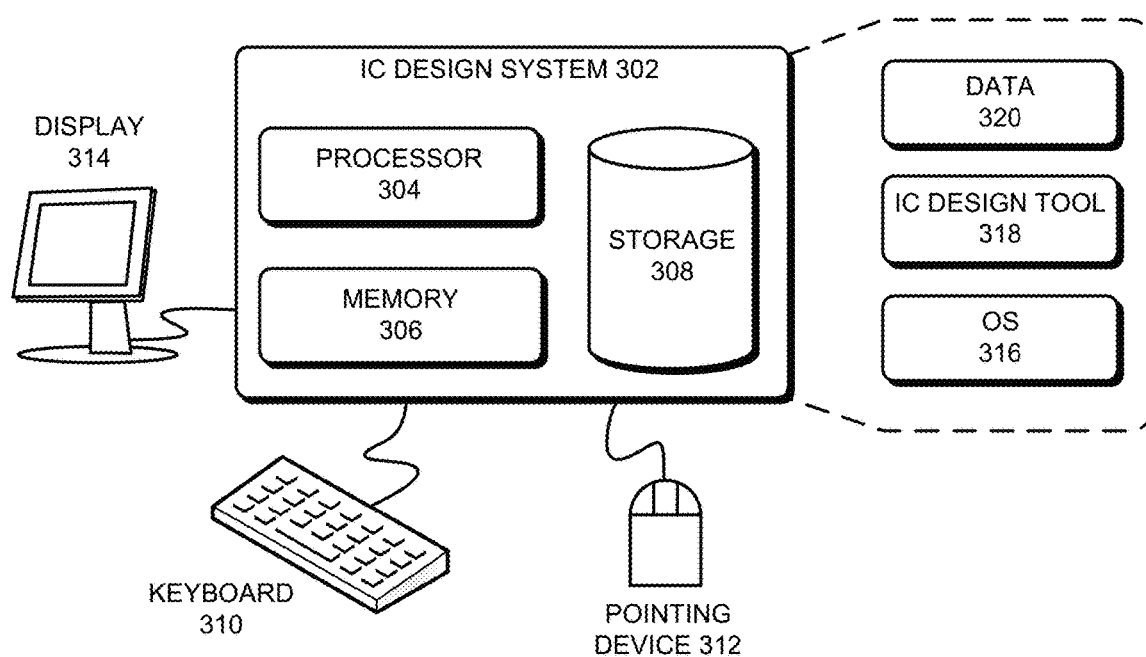
FIG. 3 illustrates an IC design system in accordance with some embodiments described herein.

The term "IC design system" generally refers to a hardware based system that is used in an overall IC design and manufacturing process. Specifically, an IC design system facilitates the design of ICs, so that the ICs can be subsequently manufactured at a semiconductor fabrication facility. FIG. 3 illustrates an IC design system in accordance with some embodiments described herein. IC design system 302 can include processor 304, memory 306, and storage device 308. Specifically, memory locations in memory 306 can be addressable by processor 304, thereby enabling processor 304 to access (e.g., via load/store instructions) and manipulate (e.g., via logical/floating point/arithmetic instructions) the data stored in memory 306. IC design system 302 can be coupled to display device 314, keyboard 310, and pointing device 312. Storage device 308 can store operating system 316, IC design tool 318, and data 320. Data 320 can include input required by IC design tool 318 and/or output generated by IC design tool 318.

IC design system 302 may automatically (or with user help) perform one or more operations that are implicitly or explicitly described in this disclosure. Specifically, IC design system 302 can load IC design tool 318 into memory 306, and IC design tool 318 can then be used to determine the resistance of a conducting structure. Next, IC design tool 318 (or another tool that is stored in storage 308) can determine whether or not an IC chip manufactured based on the IC layout will perform as desired based on the determined resistance of the conducting structure. If the IC chip is expected to perform as desired, the overall IC design and manufacturing process can proceed to the next step. Otherwise, the overall IC design and manufacturing process can return to a previous step in which the IC design can be modified (e.g., the modification can change the resistance of the conducting structure).

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A non-transitory computer-readable storage medium storing instructions that, when executed by a computer, cause the computer to perform a method for determining a resistance of a conducting structure in an integrated circuit (IC) layout, the method comprising:

determining equipotential lines in the conducting structure, wherein said determining the equipotential lines comprises detecting when a parallel run length of two adjacent boundaries in the conducting structure is greater than a distance between the two adjacent boundaries in the conducting structure;

partitioning the conducting structure into a set of polygons based on (1) the equipotential lines and (2) boundaries of the conducting structure;

discretizing the boundaries of the conducting structure to obtain a set of boundary elements;

storing, in a data structure, an association between each polygon in the set of polygons and boundary elements in the set of boundary elements that are located on boundaries of the polygon;

constructing a matrix equation by using the data structure, wherein for at least one polygon in the set of polygons, electric potentials of at least some boundary elements on the boundaries of the polygon are represented by linear combinations of electric potentials of two or more equipotential lines, and wherein the matrix equation's size is reduced by using the data structure;

determining the resistance of the conducting structure by solving the matrix equation;

using the resistance of the conducting structure to determine that an IC chip manufactured based on the IC layout is expected to perform as desired; and providing the IC layout to a next step in an integrated circuit (IC) design and manufacturing process which, when completed, produces the IC chip that contains the IC layout.

2. An integrated circuit (IC) design system, comprising:

a processor; and a non-transitory computer-readable storage medium storing instructions that, when executed by the processor, cause the IC design system to perform a method for determining a resistance of a conducting structure in an IC layout, the method comprising:

determining equipotential lines in the conducting structure, wherein said determining the equipotential lines comprises detecting when a parallel run length of two adjacent boundaries in the conducting structure is greater than a distance between the two adjacent boundaries in the conducting structure;

partitioning the conducting structure into a set of polygons based on (1) the equipotential lines and (2) boundaries of the conducting structure;

discretizing the boundaries of the conducting structure to obtain a set of boundary elements;

storing, in a data structure, an association between each polygon in the set of polygons and boundary elements in the set of boundary elements that are located on boundaries of the polygon;

constructing a matrix equation by using the data structure, wherein for at least one polygon in the set of polygons, electric potentials of at least some boundary elements on the boundaries of the polygon are represented by linear combinations of electric potentials of two or more equipotential lines, and wherein the matrix equation's size is reduced by using the data structure;

determining the resistance of the conducting structure by solving the matrix equation;

using the resistance of the conducting structure to determine that an IC chip manufactured based on the IC layout is expected to perform as desired; and providing the IC layout to a next step in an integrated circuit (IC) design and manufacturing process which, when completed, produces the IC chip that contains the IC layout.

3. A method for determining a resistance of a conducting structure in an integrated circuit (IC) layout, the method comprising:

determining equipotential lines in the conducting structure, wherein said determining the equipotential lines comprises detecting when a parallel run length of two adjacent boundaries in the conducting structure is greater than a distance between the two adjacent boundaries in the conducting structure;

partitioning the conducting structure into a set of polygons based on (1) the equipotential lines and (2) boundaries of the conducting structure;

discretizing the boundaries of the conducting structure to obtain a set of boundary elements;

storing, in a data structure, an association between each polygon in the set of polygons and boundary elements in the set of boundary elements that are located on boundaries of the polygon;

constructing a matrix equation by using the data structure, wherein for at least one polygon in the set of polygons, electric potentials of at least some boundary elements on the boundaries of the polygon are represented by linear combinations of electric potentials of two or more equipotential lines, and wherein the matrix equation's size is reduced by using the data structure;

determining the resistance of the conducting structure by solving the matrix equation;

using the resistance of the conducting structure to determine that an IC chip manufactured based on the IC layout is expected to perform as desired; and providing the IC layout to a next step in an integrated circuit (IC) design and manufacturing process which, when completed, produces the IC chip that contains the IC layout.

* * * * *